US008174112B1

(12) United States Patent
Karp et al.

(10) Patent No.: US 8,174,112 B1
(45) Date of Patent: May 8, 2012

(54) INTEGRATED CIRCUIT DEVICE WITH LOW CAPACITANCE AND HIGH THERMAL CONDUCTIVITY INTERFACE

(75) Inventors: James Karp, Saratoga, CA (US); Vassili Kireev, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 139 days.

(21) Appl. No.: 12/544,850

(22) Filed: Aug. 20, 2009

(51) Int. Cl.
*H01L 23/34* (2006.01)

(52) U.S. Cl. ........ 257/704; 257/712; 257/713; 257/702; 257/706; 257/707; 257/796; 257/675; 257/718; 257/690

(58) Field of Classification Search .................. 257/690, 257/625, 675, 706, 707, 796, 712–722
See application file for complete search history.

(56) References Cited

U.S. PATENT DOCUMENTS

| | | | | |
|---|---|---|---|---|
| 6,653,730 | B2 * | 11/2003 | Chrysler et al. | 257/704 |
| 6,921,929 | B2 * | 7/2005 | LeBoeuf et al. | 257/100 |
| 7,564,066 | B2 * | 7/2009 | Zhou et al. | 257/81 |

OTHER PUBLICATIONS

Karp, James et al., "Effect of Flip-Chip Package Parameters on CDM Discharge," *Proc. of the 2008 Electrical Overstress/Electrostatic Discharge Symposium*, Sep. 7-11, 2008, pp. 1-5, Tucson, Arizona, USA.

* cited by examiner

*Primary Examiner* — Wai Sing Louie
*Assistant Examiner* — Bilkis Jahan
(74) *Attorney, Agent, or Firm* — Kenneth Glass; LeRoy D. Maunu; Lois D. Cartier

(57) ABSTRACT

An integrated circuit device includes an integrated circuit formed in a semiconductor die and an integrated circuit package containing the semiconductor die. The integrated circuit package includes a thermal interface material substantially between the semiconductor die and a heat spreader of the integrated circuit device for conducting heat from the semiconductor die to the heat spreader. The thermal interface material includes diamond particles and has a thickness selected to reduce capacitance between the semiconductor die and the heat spreader over that of a conventional integrated circuit device without reducing the rate of thermal conduction from the semiconductor die to the heat spreader. As a result, the integrated circuit device has improved electrostatic discharge immunity.

16 Claims, 8 Drawing Sheets

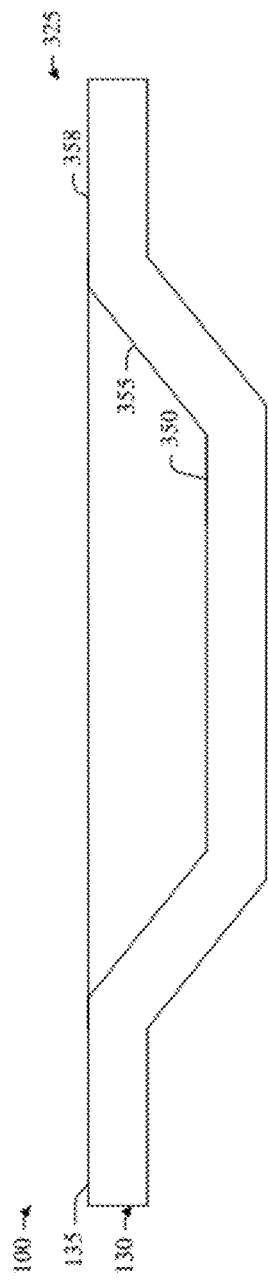
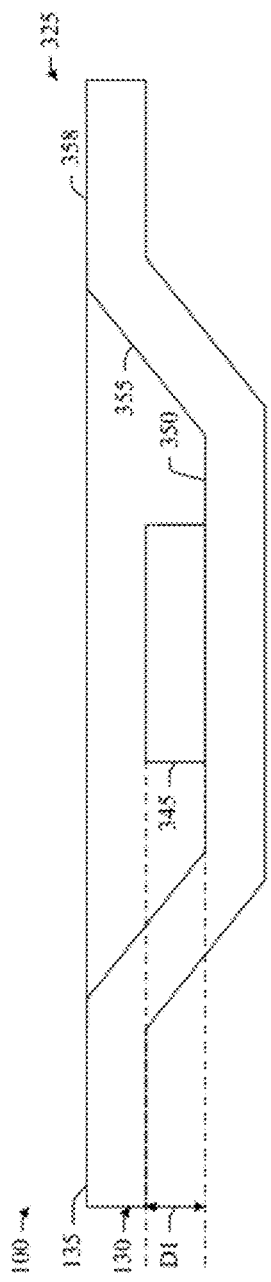
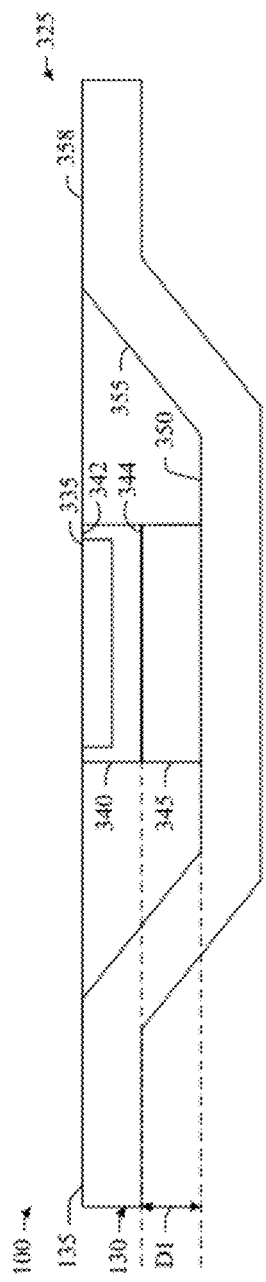

INTEGRATED CIRCUIT DEVICE WITH LOW CAPACITANCE AND HIGH THERMAL CONDUCTIVITY INTERFACE

FIELD OF THE INVENTION

The invention relates to integrated circuit devices. More particularly, the invention relates to packaged integrated circuit devices with reduced susceptibility to electrostatic discharge.

BACKGROUND

A charge device model (CDM) is often used to simulate charge build-up and electrostatic discharge (ESD) in a packaged integrated circuit device. Generally, the build-up of charge in the packaged integrated circuit device is simulated by applying a voltage between an input-output (I/O) pad of an integrated circuit formed in a semiconductor die of the packaged integrated circuit device and a ground plane external to the packaged integrated circuit device. The electrostatic discharge is simulated by providing a conductive path from the input-output pad to a ground potential and causes a peak current to flow through the input-output pad. Because a sufficiently high peak-current flowing through the input-output pad may cause damage to components of the integrated circuit, reducing the peak electrostatic discharge current is desirable in a packaged integrated circuit device.

Generally, reducing the peak electrostatic discharge current in a packaged integrated circuit device improves electrostatic discharge immunity of the packaged integrated circuit device, but adversely affects other performance characteristics of the packaged integrated circuit device. For instance, reducing the peak electrostatic discharge current in the packaged integrated circuit device may reduce a rate of thermal conduction from a semiconductor die in the packaged integrated circuit device to the ambient environment of the packaged integrated circuit device.

An alternative technique for improving electrostatic discharge immunity of a packaged integrated circuit device involves increasing the number and sizes of components in electrostatic discharge protection circuitry at input and output pads of the packaged integrated circuit device. As a result, the electrostatic discharge protection circuitry consumes additional die area of a semiconductor die in the packaged integrated circuit device. Additionally, capacitive loading increases at the input and output pads of the packaged integrated circuit device, which reduces the speed of signals propagating through the input and output pads.

In light of the above, a need exists for reducing a peak electrostatic discharge current in a packaged integrated circuit device without reducing a rate of thermal conduction from a semiconductor die in the packaged integrated circuit device to the ambient environment of the packaged integrated circuit device. A further need exists for reducing the peak electrostatic discharge current in the packaged integrated circuit device without increasing the area of the semiconductor die consumed by electrostatic discharge protection circuitry in the packaged integrated circuit device.

SUMMARY

In various embodiments, a packaged integrated circuit device includes an integrated circuit formed in a semiconductor die and an integrated circuit package containing the semiconductor die. The integrated circuit package includes a thermal interface material substantially between the semiconductor die and a heat spreader of the integrated circuit package for conducting heat from the semiconductor die to the heat spreader. The thermal interface material includes diamond particles and has a thickness selected to reduce capacitance between the semiconductor die and the heat spreader over that of a conventional packaged integrated circuit device without reducing the rate of thermal conduction from the semiconductor die to the heat spreader. As a result, a peak electrostatic discharge current is reduced in the integrated circuit from that of conventional packaged integrated circuit devices. In this way, the packaged integrated circuit device has improved electrostatic discharge immunity over conventional packaged integrated circuit devices. Moreover, the area of the semiconductor die consumed by electrostatic discharge protection circuitry need not be increased to improve the electrostatic discharge immunity of the packaged integrated circuit device.

A packaged integrated circuit device, in accordance with one embodiment of the present invention, includes a package substrate, a semiconductor die, a heat spreader, and a thermal interface material. The semiconductor die includes an integrated circuit and is coupled to the package substrate. The heat spreader is separated from the semiconductor die by a distance of at least one hundred and fifty microns, e.g., three hundred microns. Moreover, the heat spreader dissipates heat to an ambient environment of the heat spreader. The thermal interface material is disposed between the semiconductor die and the heater spreader for conducting heat from the semiconductor die to the heat spreader and includes diamond particles for minimizing a peak electrostatic discharge current of the packaged integrated circuit device.

A method of manufacturing a packaged integrated circuit device having a reduced electrostatic discharge peak current, in accordance with one embodiment of the present invention, includes depositing a thermal interface material including diamond particles on a heat spreader for conducting heat from a semiconductor die to the heat spreader. The thermal interface material includes diamond particles for minimizing a peak electrostatic discharge current of the packaged integrated circuit device. The method further includes attaching a semiconductor die including an integrated circuit to the thermal interface material such that the heat spreader is separated from the semiconductor die by a distance of at least one hundred and fifty microns, e.g., three hundred microns.

A packaged integrated circuit device, in accordance with one embodiment, includes a package substrate, semiconductor die, a plurality of conductive taps, a heat spreader, and a thermal interface material. The semiconductor die includes an integrated circuit. The conductive taps are formed on the integrated circuit and establish electrical connections between the integrated circuit and the package substrate. The heat spreader dissipates heats to an ambient environment and is separated from the semiconductor die by a distance of at least one hundred and fifty microns. e.g., three hundred microns. The thermal interface material is disposed between the heat spreader and the semiconductor die for conducting heat away from the semiconductor die to the heat spreader. Moreover, the thermal interface material includes diamond particles for minimizing a peak electrostatic discharge current of the packaged integrated circuit device.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings:

FIG. 7A is a cross-sectional view of a portion of the packaged integrated circuit device of FIG. 1, in accordance with an embodiment of the present invention;

FIG. 7B is a cross-sectional view of a portion of the packaged integrated circuit device of FIG. 1 after a thermal interface material has been deposited on a heat spreader of the packaged integrated circuit device of FIG. 7A, in accordance with an embodiment of the present invention;

FIG. 7C is a cross-sectional view of a portion of the packaged integrated circuit device of FIG. 1 after a semiconductor die has been attached to the thermal interface material of the packaged integrated circuit device of FIG. 7B, in accordance with an embodiment of the present invention;

DETAILED DESCRIPTION

In various embodiments, a packaged integrated circuit device includes a thermal interface material substantially between a semiconductor die and a heat spreader of the packaged integrated circuit device. The thermal interface material includes diamond particles and has a thickness selected to reduce capacitance between the semiconductor die and the heat spreader over that of a conventional packaged integrated circuit device without reducing the rate of thermal conduction from the semiconductor die to the heat spreader. As a result, a peak electrostatic discharge current is reduced in the packaged integrated circuit device from that of the conventional packaged integrated circuit device, which improves electrostatic discharge immunity in the packaged integrated circuit device over that of the conventional packaged integrated circuit device. In this way, the peak electrostatic discharge current is minimized in the packaged integrated circuit device.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
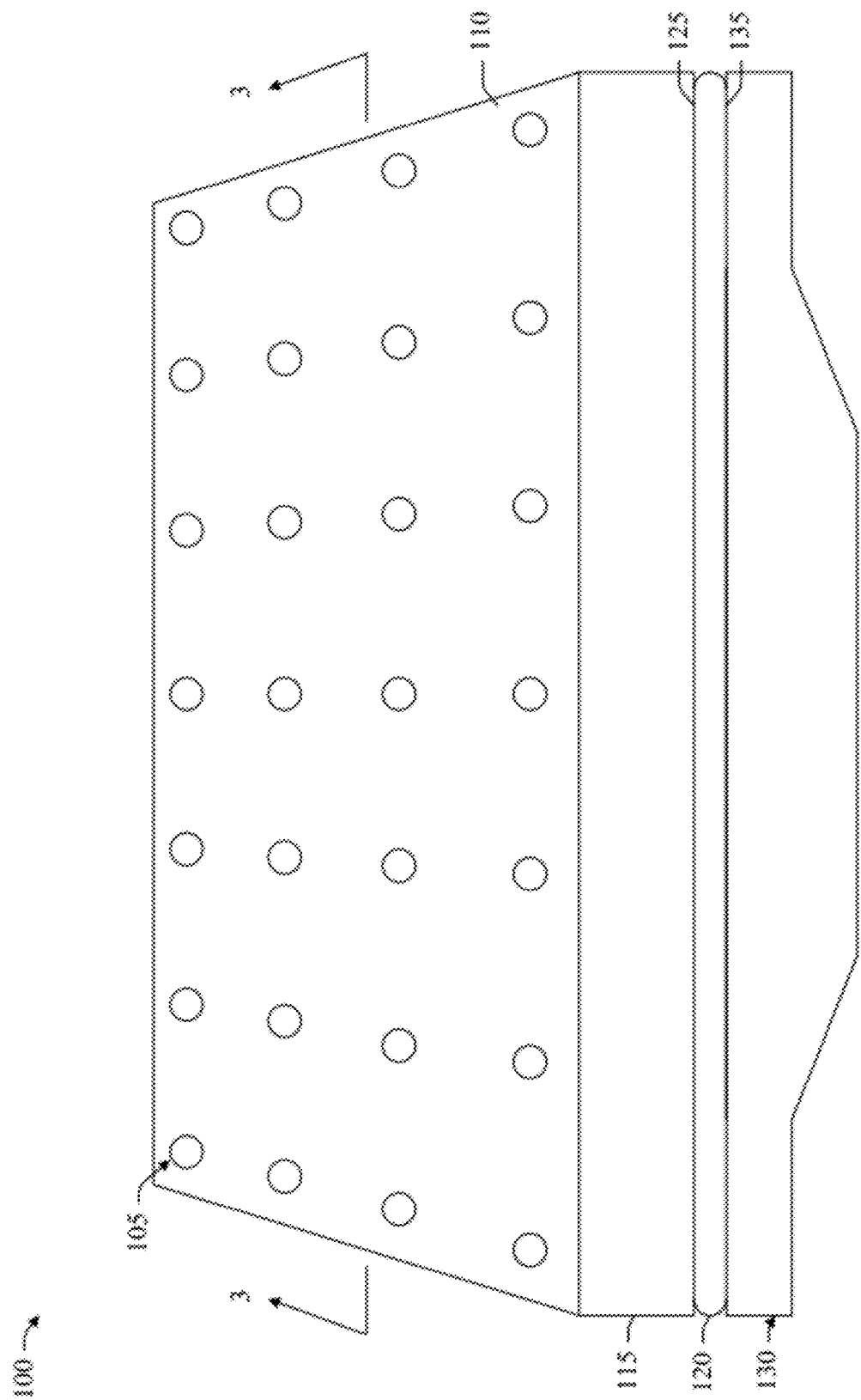
FIG. 1 is a perspective view of a packaged integrated circuit device, in accordance with an embodiment of the present invention.

FIG. 1 is a perspective view of a packaged integrated circuit device 100 in accordance with an embodiment of the present invention. The packaged integrated circuit device 100 includes a package substrate 115, a heat spreader 130, and a spacer material 120 between the package substrate 115 and the heat spreader 130. In various embodiments, the spacer material 120 is an adhesive material for mounting the heat spreader 130 to the package substrate 115, and the package substrate 115 has a back side 125 contacting the spacer material 120. Additionally, the packaged integrated circuit device 100 includes conductive bumps 105 disposed on a front side 110 of the package substrate 115. The heat spreader 130 includes a surface 135 contacting the spacer material 120. In various embodiments, the packaged integrated circuit device 100 is a flip-chip device.

Figure 2:
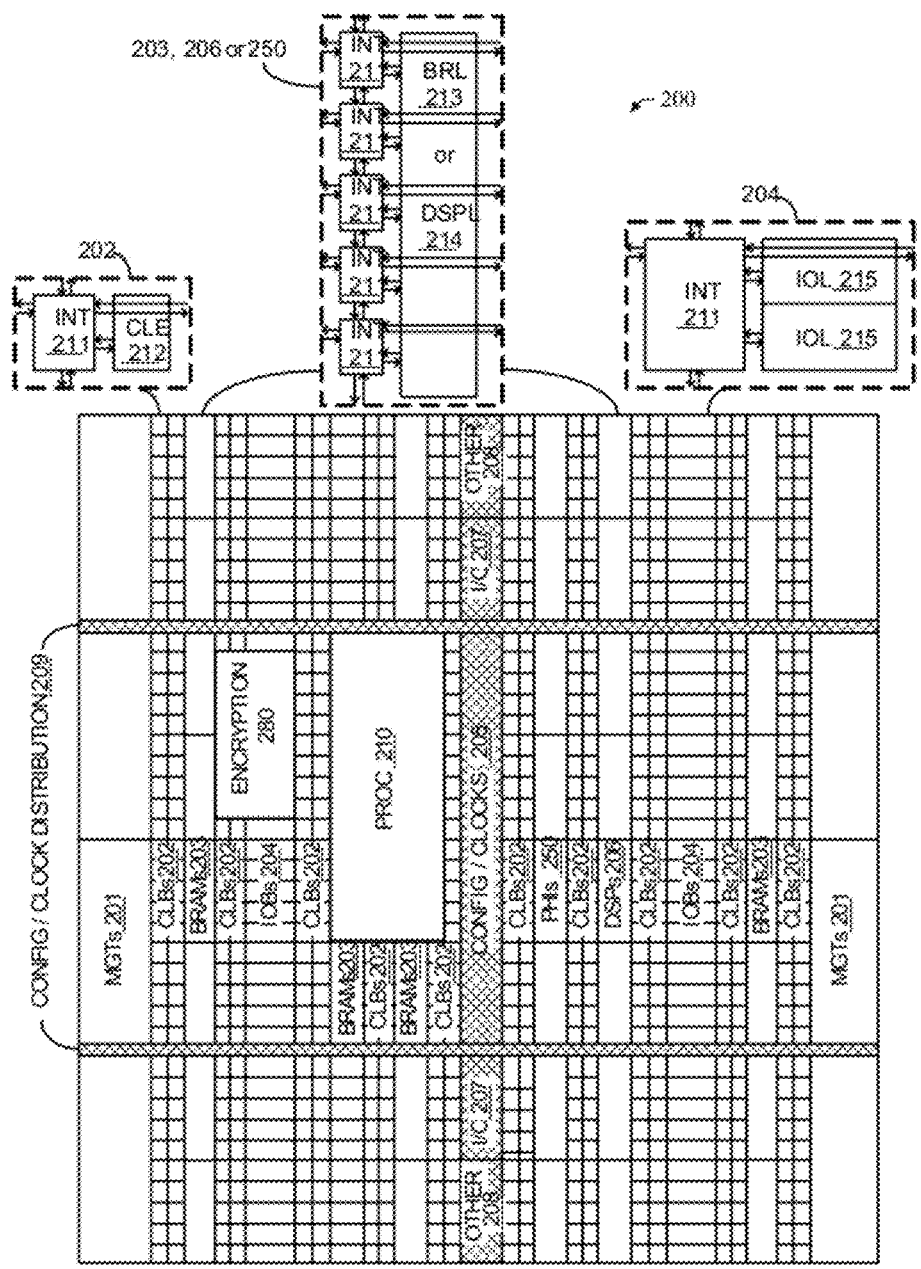
FIG. 2 is a block diagram of an integrated circuit device having a field programmable gate array architecture, in accordance with an embodiment of the present invention.

FIG. 2 is a block diagram of an exemplary integrated circuit that may be included in the packaged integrated circuit device 100, in accordance with an embodiment of the present invention. In the embodiment of FIG. 2, the packaged integrated circuit device 100 includes a field programmable gate array (FPGA) 200 having a FPGA architecture that includes a large number of different programmable tiles including multi-gigabit transceivers (MGTs) 201, configurable logic blocks (CLBs) 202, random access memory blocks (BRAMs) 203, input/output blocks (IOBs) 204, configuration and clocking logic (CONFIG/CLOCKS) 205, digital signal processing blocks (DSPs) 206, specialized input/output blocks (I/O) 207 (e.g., configuration ports and clock ports), interface tiles (PHIs) 250 and other programmable logic 208 such as digital clock managers, analog-to-digital converters, system monitoring logic, and so forth. In addition, packaged integrated circuit device 100 may include one or more dedicated processor blocks (PROC) 210 and/or an encryption logic block (ENCRYPTION) 280. In other embodiments, the FPGA architecture of the field programmable gate array 200 may include more or fewer programmable tiles, or other programmable tiles, than those illustrated in FIG. 2.

In some embodiments, each programmable tile of the FPGA 200 includes a programmable interconnect element (INT) 211 having standardized connections to and from a corresponding programmable interconnect element (INT) 211 in each adjacent tile. Therefore, the programmable interconnect elements (INT) 211 taken together implement a programmable interconnect structure for the FPGA 200. The programmable interconnect element (INT) 211 also includes the connections to and from the programmable logic 208 within the same tile, as shown by the examples included at the top of FIG. 2.

For example, a CLB 202 can include a configurable logic element (CLE) 212 that can be programmed to implement user logic and a single programmable interconnect element (INT) 211. A BRAM 203 can include a BRAM logic element (BRL) 213 in addition to one or more programmable interconnect elements (INT) 211. Typically, the number of programmable interconnect elements (INT) 211 included in a tile depends on the height of the tile. In the pictured embodiment, a BRAM 203 has the same height as five CLBs 202, but other numbers of interconnected elements (e.g., six) can also be used. A DSP block 206 can include a DSP logic element (DSPL) 214 in addition to an appropriate number of programmable interconnect elements (INT) 211. An IOB 204 can include, for example, two instances of an input/output logic element (IOL) 215 in addition to one instance of the programmable interconnect element (INT) 211. As will be clear to those of skill in the art, the actual I/O pads connected, for example, to the input/output logic element (IOL) 215 are manufactured using metal layered on the various illustrated logic blocks, and typically are not confined to the area of the input/output logic element (IOL) 215.

Configuration/clock distribution logic 309 includes configuration, clock, and other control logic. Horizontal areas 209 extending from this column are used to distribute the clocks and configuration signals across the breadth of the FPGA.

In some embodiments, the FPGA 200 utilizing the FPGA architecture illustrated in FIG. 2 includes additional logic blocks that disrupt the regular columnar structure making up a large part of the FPGA 200. The additional logic blocks can be programmable blocks and/or dedicated logic. For example, the processor block (PROC) 210 shown in FIG. 2 spans several columns of CLBs 202 and BRAMs 203.

FIG. 2 is intended to illustrate an exemplary FPGA architecture of the FPGA 200. The numbers of logic blocks in a column, the relative width of the columns, the number and order of columns, the types of logic blocks included in the columns, the relative sizes of the logic blocks, the incorporation of hard blocks such as processor block (PROC) 210, and the interconnect/logic implementations included at the top of FIG. 2 will vary in accordance with the requirements of each application. In various embodiments, the FPGA 200 has more than one adjacent column of CLBs 202 to facilitate the efficient implementation of user logic, but the number of adjacent columns of CLBs 202 varies with the overall size of the FPGA 200. Further, FPGA 200 is merely one example of an integrated circuit that can be included in packaged integrated circuit 100. Virtually any other type of integrated circuit can be included, including programmable, non-programmable, and partially programmable integrated circuits.

Figure 3:
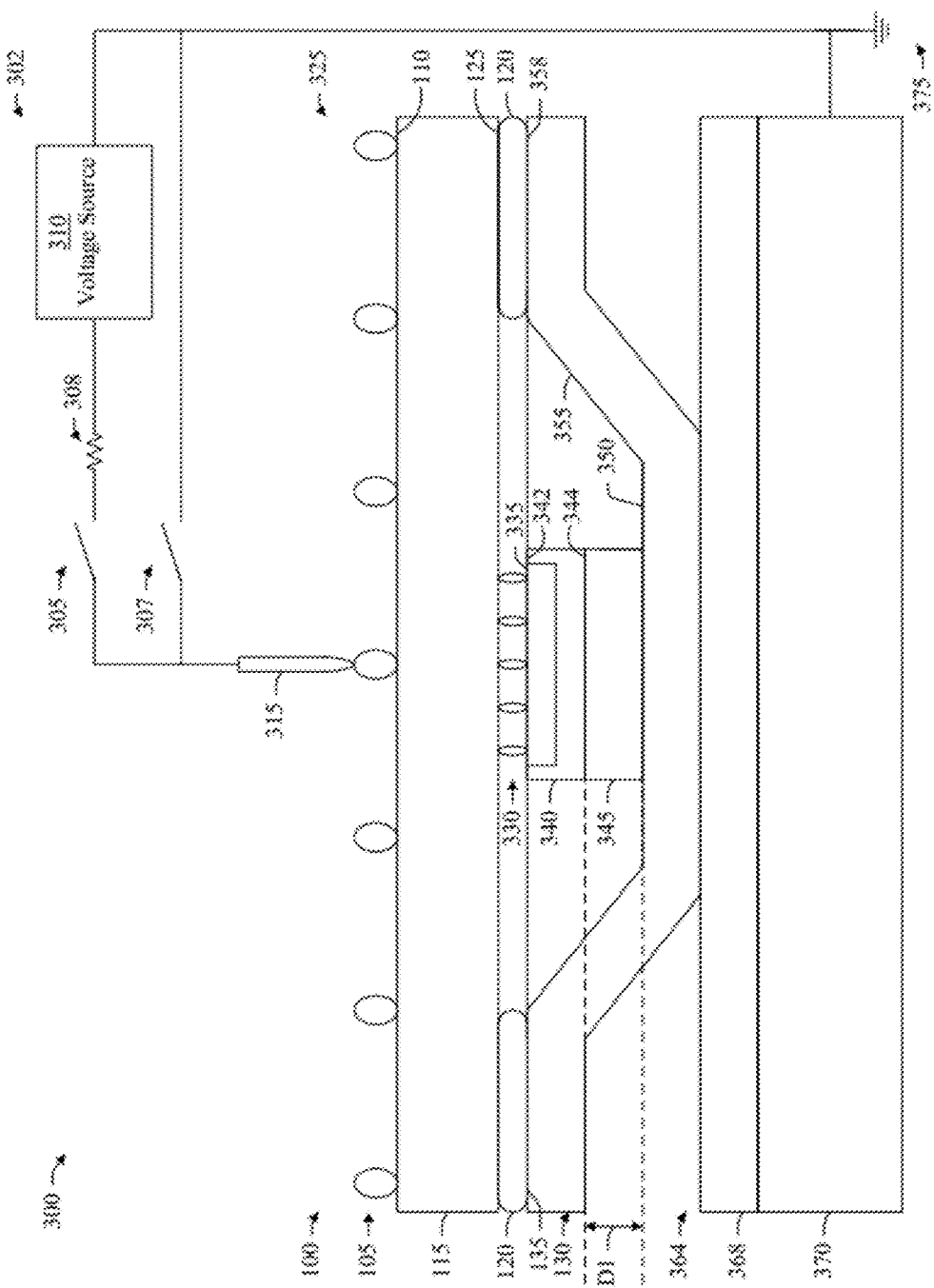
FIG. 3 is a cross-sectional view of a packaged integrated circuit device in a test environment, in accordance with an embodiment of the present invention.

FIG. 3 illustrates a cross-sectional view of the packaged integrated circuit device 100 taken along the line 3-3 in FIG. 1 in a test environment 300, in accordance with an embodiment of the present invention. The test environment 300 includes an integrated circuit tester 302 and a test fixture 364. As illustrated in FIG. 3, the packaged integrated circuit device 100 is disposed on the test fixture 364 and coupled (e.g., connected) to the integrated circuit tester 302.

The packaged integrated circuit device 100 includes a semiconductor die 340 mounted in an integrated circuit package 325. The semiconductor die 340 includes an integrated circuit 335 formed in the semiconductor die 340. The integrated circuit package 325 includes conductive taps 330 and a thermal interface material 345 in addition to the conductive bumps 105, the package substrate 115, the spacer material 120, and the heat spreader 130. In various embodiments, the packaged integrated circuit device 100 is a flip-chip device.

The heat spreader 130 is composed of a thermally conductive material, such as a metal. Moreover, the surface 135 of the heat spreader 130 includes a top surface 350, an extended surface 355, and a flange surface 358. In the illustrated embodiment, the extended surface 355 of the heat spreader 130 extends away from the top surface 350 at an angle and extends away from the flange surface 358 at substantially the same angle. For example, the angle may be approximately forty-five degrees. Moreover, the top surface 350 and the flange surface 358 are substantially parallel to each other. In various embodiments, the heat spreader 130 forms a lid (e.g., a cap) for the integrated circuit package 325. In these embodiments, the heat spreader 130 is a lid-heat spreader of the integrated circuit package 325.

The thermal interface material 345 is disposed on the top surface 350 of the heat spreader 130 and includes diamond particles. In this way, the thermal interface material 345 is attached to the top surface 350 of the heat spreader 130. For example, the diamond particles may be a powdered diamond mineral. In various embodiments, the thermal interface material 345 includes a mixture of diamond particles and an epoxy, and has a thermal conductivity greater than one thousand watts per meter per kelvin (1000 W/mk). For example, the thermal interface material 345 may have a thermal conductivity in the range of one-thousand to two thousand watts per meter per kelvin (1000-2000 W/mk).

Moreover, the epoxy may have a dielectric constant of approximately three (3) and the diamond particles may have a dielectric constant of approximately five and six-tenths (5.6). As a result, the dielectric constant of the thermal interface material 345 may be in a range of three to five and six-tenths (3-5.6), depending on the ratio of diamond particles to epoxy in the thermal interface material 345. For example, a thermal interface material 345 having a mixture of fifty percent (50%) diamond particles and fifty percent (50%) epoxy would have a dielectric constant of approximately four and three-tenths (4.3). As another example, a thermal interface material 345 having a mixture of fifty percent (80%) diamond particles and twenty percent (20%) epoxy would have a dielectric constant of approximately five (5).

In one embodiment, the epoxy is a heat conductive adhesive available from Shin-Etsu Chemical Co., Ltd. of Tokyo, Japan and identified by part number KJR9080. In various embodiments, the thermal interface material 345 includes a mixture of diamond particles and epoxy, in which the percentage of diamond particles is maximized in the mixture while preserving mechanical properties (e.g., adhesion, tensile strength) of the thermal interface material 345. In this way, the capacitance of the packaged integrated circuit device 100 (i.e., capacitance between the integrated circuit 335 and the heat spreader 130) is reduced from that of a conventional integrated circuit device without reducing a rate of thermal conduction from the semiconductor die 340 to the heat spreader 130.

The semiconductor die 340 has a front side 342 and a back side 344. The front side 342 of the semiconductor die 340 includes a portion of the integrated circuit 335. Moreover, the conductive taps 330 are attached to the portion of the integrated circuit 335 on the front side 342 of the semiconductor die 340. For example, the conductive taps 330 may be solder bumps formed on conductive pads (e.g., power pads, ground pads, and input-output pads) of the integrated circuit 335. In various embodiments, the front side 342 of the semiconductor die 340 is substantially parallel to the back side 344 of the semiconductor die 340.

The back side 344 of the semiconductor die 340 is disposed on the thermal interface material 345 such that the thermal interface material 345 is located substantially between the back side 344 of the semiconductor die 340 and the top surface 350 of the heat spreader 130. In this way, the back side 344 of the semiconductor die 340 is attached to the thermal interface material 345. As illustrated in FIG. 3, the thermal interface material 345 has a thickness that is equal to a distance D1 between the back side 344 of the semiconductor die 340 and the top surface 350 of the heat spreader 130. In various embodiments, the thickness of the thermal interface material 345 is in a range of one hundred fifty microns to four-hundred microns (150 um to 400 um). In one embodiment, the thickness of the thermal interface material 345 is approximately three hundred microns (300 um). (The term "approximately" is used herein to denote a value within ten percent of the given approximate value.)

The spacer material 120 is disposed on the flange surface 358 of the heat spreader 130. In this way, the spacer material 120 is attached to the flange surface 358. For example, the spacer material 120 may contain an epoxy material. In some embodiments, the spacer material 120 is a thermal interface material. For example, the spacer material 120 may be a mixture of an epoxy and a conductive material, such as sapphire ($Al_2O_3$), and have a thermal conductivity of approximately twenty watts per meter per kelvin (20 W/mk). In one embodiment, the epoxy is a heat conductive adhesive available from Shin-Etsu Chemical Co., Ltd. of Tokyo, Japan and identified by part number KJR9080. In various embodiments, the thermal conductivity of the spacer material 120 (i.e., a low-conductivity thermal interface material) is substantially lower than the thermal conductivity of the thermal interface material 345 (i.e., a high-conductivity thermal interface material).

The back side 125 of the package substrate 115 is disposed on the conductive taps 330 and the spacer material 120. In this way, the back side 125 of the package substrate 115 is attached to the conductive taps 330 and the spacer material 120. Additionally, the conductive bumps 105 are disposed on the front side 110 of the package substrate so as to attach the conductive bumps 105 to the front side 110 of the package substrate 115. For example, the conductive bumps 105 may be solder bumps formed on the front side 110 of the package substrate 115. The package substrate 115 forms electrical connections between the conductive taps 330 and the conductive bumps 105. For example, the package substrate 115 may be a semiconductor package substrate formed with electrical conductors for electrically connecting each conductive bump 105 to a corresponding conductive tap 330. In various embodiments, the front side 110 of the package substrate 115 is substantially parallel with the back side 125 of the package substrate 115.

The integrated circuit tester 302 includes a voltage source 310, a charge switch 305, a discharge switch 307, a resistor 308, and a probe 315. The voltage source 310 of the integrated circuit tester 302 is coupled (e.g., connected) to a ground potential 375. Further, the voltage source 310 is coupled (e.g., connected) to one end of the resistor 308 and the other end of the resistor 308 is coupled (e.g., connected) to one end of the charge switch 305. The other end of the charge switch 305 is coupled (e.g., connected) to the probe 315. Additionally, one end of the discharge switch 307 is coupled (e.g., connected) to the ground potential 375 and the other end of the discharge switch 307 is coupled (e.g., connected) to the probe 315. For example, the probe 315 may be an electrically conductive rod.

The test fixture 364 includes an insulating layer 368 and a charge plate 370. In the test fixture 364, the insulating layer 368 is attached to the charge plate 370, and the charge plate 370 is coupled to the ground potential 375. In various embodiments, the probe 315 and the charge plate 370 are composed of an electrically conductive material, such as a metal, and the insulating layer 368 is composed of a Mylar film.

In operation, the packaged integrated circuit device 100 is placed on the test fixture 364 so that the top surface 350 of the heat spreader 130 contacts the insulating layer 368 of the test fixture 364. Additionally, the charge switch 305 and the discharge switch 307 are opened so that the probe 315 is not electrically connected to the voltage source 310 or the ground potential 375. The probe 315 is then contacted with one of the conductive bumps 105 and the charge switch 305 is closed to establish an electrically conductive path between the probe 315 and the voltage source 310. The voltage source 310 provides a voltage (i.e., a zap voltage) and a current to the conductive bump 105 in contact with the probe 315 through the resistor 308, the charge switch 305, and the probe 315. In response to the voltage and current from the voltage source 310, an electrical charge forms (i.e., builds up) in the integrated circuit 335. The charge switch 305 is then opened and the electrical charge remains in the integrated circuit 335. In this way, the integrated circuit tester 302 simulates an electrostatic charge build up in the packaged integrated circuit device 100.

With the electrical charge remaining in the integrated circuit 335, the discharge switch 307 is closed to establish an electrically conductive path between the probe 315 and the ground potential 375. In response, the electrical charge formed in the integrated circuit 335 is discharged to the ground potential 375 through the probe 315 and the discharge switch 307. In this way, the integrated circuit tester 302 simulates electrostatic discharge of the electrical charge from the integrated circuit 335.

In various embodiments, the resistor 308 limits the current flowing from the voltage source 310 to the conductive bump 105 in contact with the probe 315. For example, the voltage source 310 may generate a voltage of two hundred volts (200 V) and the resistor 308 may have a resistance of one megaohm (1 M ohm). In this example, the resistor 308 limits the current flowing from the voltage source 310 to the conductive bump 105 in contact with the probe 315 to two hundred microamps (200 uA). In various embodiments, the resistance of the resistor 308 is in a range of one megaohm to three hundred megaohms (1 M ohm-300 M ohms) and the probe 315 has a series resistance of one ohm (1 ohm). Further, the capacitance of the test fixture 364 is in a range of four picofarads to thirty-eight picofarads (4 pF-38 pF) and the capacitance of the packaged integrated circuit device 100 is in a range of one hundred picofarads to two thousand picofarads (100 pF-2000 pF). Generally, the packaged integrated circuit device 100 and the integrated circuit tester 302 form a resistance-capacitance-inductance (RCL) network having a time constant for charging and discharging the packaged integrated circuit device 100. This resistance-capacitance-inductance network may be modeled based on the capacitance of the packaged integrated circuit device 100, the capacitance of the test fixture 364, the resistance of the resistor 308, and the resistance of the probe 315. Moreover, the time constant for charging and discharging the packaged integrated circuit device 100 increases as the resistance of the resistor 308 increases.

During the discharge of the electrical charge from the integrated circuit 335, a peak electrostatic discharge current flows through the portion of the integrated circuit 335 on the front side 342 of the semiconductor die 340. In particular, the peak current flows through a conductive pad of the integrated circuit 335 and components of the integrated circuit 335 connected to the conductive pad. For example, the components of the integrated circuit 335 through which the peak current flows may include conductive traces, input buffers, output buffers, input-output buffers, electrostatic protection devices, and the like. Moreover, the peak current depends in part on the voltage (i.e., the zap voltage) applied to the integrated circuit 335 by the voltage source 310.

Generally, the integrated circuit 335 is manufactured to withstand an electrostatic discharge of a specified voltage. For example, the integrated circuit 335 may be manufactured to withstand an electrostatic discharge of five hundred volts (500V). Moreover, various components of the integrated circuit 335 connected to the conductive pads on the front side 342 of the semiconductor die 340 are designed to withstand a peak current. For example, the components of the integrated circuit 335 may be manufactured to withstand a peak current of ten amperes (10A). Further, the size and number of components in the integrated circuit 335 required to withstand an electrostatic discharge without damage at a specified voltage (i.e., a zap voltage) increases as the peak electrostatic discharge current increases. Thus, the size and number of components in the integrated circuit 335 connected to the conductive pads of the integrated circuit 335 may be reduced by reducing the peak electrostatic discharge current at the specified voltage (e.g., the zap voltage).

The peak electrostatic discharge current of the packaged integrated circuit device 100 also depends in part on the capacitance between the integrated circuit 335 of the semiconductor die 340 and the heat spreader 130. Generally, the peak electrostatic discharge current increases as the capacitance between the semiconductor die 340 and the heat spreader 130 increases. Thus, reducing the capacitance between the integrated circuit 335 of the semiconductor die 340 and the heat spreader 130 will tend to reduce the peak electrostatic discharge current. Moreover, reducing the capacitance between the semiconductor die 340 and the heat spreader 130 increases slew rates and reduces propagation delays of signals received by the integrated circuit 335 and output from the integrated circuit 335. Experimental results showing the relationship between the peak electrostatic discharge current of a flip-chip package and the capacitance of the flip-chip package are disclosed in "Effect of Flip-Chip Package Parameters on CDM Discharge," by James Karp, Vassili Kireev, Dean Tsaggaris, and Mohammed Fakhruddin, Electrical Overstress/Electrostatic Discharge Symposium, Sep. 7-11, 2008, which is incorporated herein by reference in its entirety.

In various embodiments of the packaged integrated circuit device 100, the distance D1 between the semiconductor die 340 and the heat spreader 130 is selected to reduce capacitance between the semiconductor die 340 and the heat spreader 130 in comparison to conventional packaged integrated circuit devices, without reducing thermal conductivity from the semiconductor die 340 to the heat spreader 130. Because the thermal conductivity of the thermal interface material 345 is higher than that of conventional thermal interface materials, the distance D1 between semiconductor die 340 and the heat spreader 130 may be increased from that of a conventional packaged integrated circuit device to reduce the capacitance between the semiconductor die 340 and the heat spreader 130 without reducing the rate of thermal conduction from the semiconductor die 340 to the heat spreader 130. In this way, the peak electrostatic discharge current is reduced for a specified voltage (i.e., zap voltage) and electrostatic immunity is increased in the packaged integrated circuit device 100. As a result, the size and number of components in the integrated circuit 335 for providing electrostatic discharge immunity may be reduced. For example, the widths of conductive traces between conductive pads and buffers (e.g., input buffers and output buffers) in the integrated circuit 335 may be reduced, which further reduces the capacitance of the conductive pads.

Figure 4:
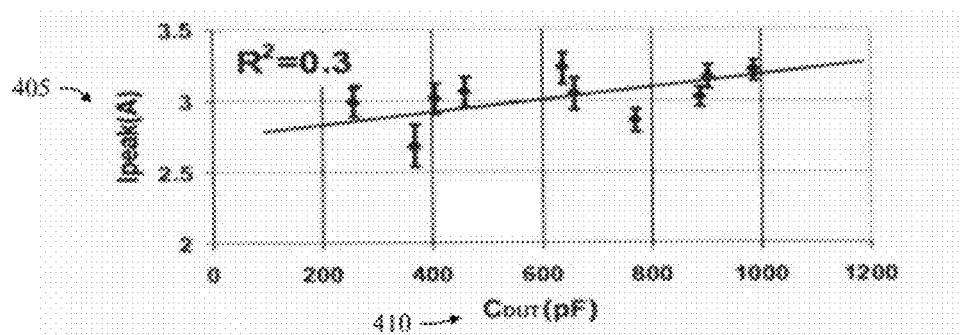
FIG. 4 is a graph of peak electrostatic discharge current as a function of capacitance of a packaged integrated circuit device, in accordance with an embodiment of the present invention.

FIG. 4 illustrates peak electrostatic discharge current 405 as a function of capacitance 410 of the packaged integrated circuit device 100, in accordance with an embodiment of the present invention. The capacitance 410 of the packaged integrated circuit device 100 is the capacitance between the integrated circuit 335 and the heat spreader 130 of the packaged integrated circuit device 100. As illustrated in FIG. 4, the peak electrostatic discharge current (Ipeak) 405 increases substantially linearly with an increase in the capacitance 410 ($C_{DUT}$) of the packaged integrated circuit device 100. In various embodiments, the packaged integrated circuit device 100 is manufactured to minimize (e.g., reduce) the peak electrostatic discharge current 405 by minimizing (e.g., reducing) the capacitance 410 of the packaged integrated circuit device 100, as is described more fully herein.

Figure 5:
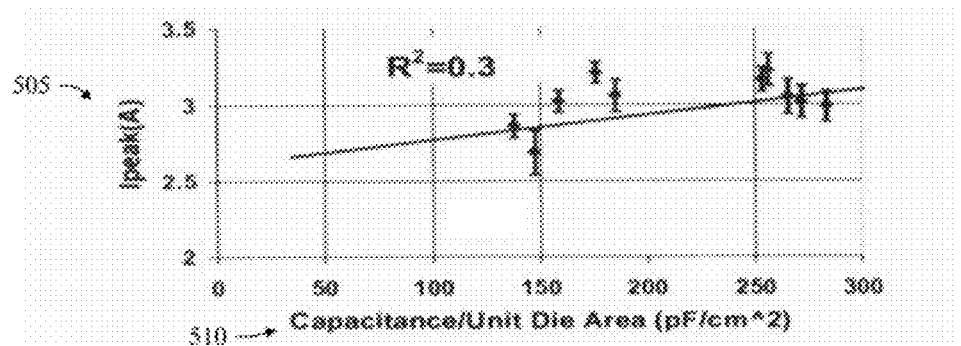
FIG. 5 is a graph of peak electrostatic discharge current as a function of capacitance per unit die area of a semiconductor die in a packaged integrated circuit device, in accordance with an embodiment of the present invention.

FIG. 5 illustrates peak electrostatic discharge current 505 as a function of capacitance per unit die area 510 of the semiconductor die 340 in the packaged integrated circuit device 100, in accordance with an embodiment of the present invention. As illustrated in FIG. 5, the peak electrostatic discharge current (Ipeak) 505 increases substantially linearly with an increase in the capacitance per unit die area 510 (Capacitance/Unit Die Area) of the semiconductor die 340. In various embodiments, the packaged integrated circuit device 100 is manufactured to minimize (e.g., reduce) the peak electrostatic discharge current 505 by minimizing (e.g., reducing) the capacitance per unit die area 510 of the semiconductor die 340, as is described more fully herein.

Figure 6:
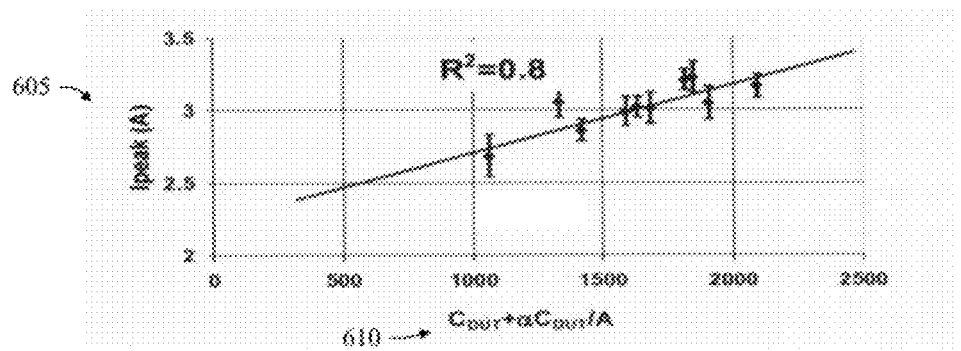
FIG. 6 is a graph of peak electrostatic discharge current as a function of a linear combination of capacitance of a packaged integrated circuit device and capacitance per unit die area of a semiconductor die in the packaged integrated circuit device, in accordance with an embodiment of the present invention.

FIG. 6 illustrates peak electrostatic discharge current 605 as a function of capacitance 610 of the packaged integrated circuit device 100, in accordance with an embodiment of the present invention. The capacitance 610 includes a capacitance ($C_{DUT}$) between the integrated circuit 335 and the heat spreader 130 as well as a capacitance per unit die area ($C_{DUT}/A$) of the semiconductor die 340. As illustrated in FIG. 6, the peak electrostatic discharge current (Ipeak) 605 is a linear function ($C_{DUT}+\alpha C_{DUT}/A$) of the capacitance between the integrated circuit 335 and the heat spreader 130 and the capacitance per unit die area of the semiconductor die 340. Moreover, the peak electrostatic discharge current 605 increases substantially linearly with an increase in the capacitance 610. In various embodiments, the packaged integrated circuit device 100 is manufactured to minimize (e.g., reduce) the peak electrostatic discharge current 605 by minimizing (e.g., reducing) the capacitance 610 of the packaged integrated circuit device 100, as is described more fully herein.

FIGS. 7A-7G illustrate a process for manufacturing the packaged integrated circuit device 100, in accordance with an embodiment of the present invention.

FIG. 7A illustrates a cross-sectional view of a portion of the packaged integrated circuit device 100 taken along the line 3-3 of FIG. 1. The portion of the packaged integrated circuit device 100 illustrated in FIG. 7A is the heat spreader 130 of the integrated circuit package 315 in the packaged integrated circuit device 100.

FIG. 7B illustrates a portion of the packaged integrated circuit device 100 after the thermal interface material 345 has been deposited on the heat spreader 130 in the packaged integrated circuit device 100 of FIG. 7A, in accordance with an embodiment of the present invention. As illustrated in FIG. 7B, the thermal interface material 345 is disposed on the top surface 350 of the heat spreader 130. In various embodiments, the thermal interface material 345 includes an epoxy and diamond particles that are mixed with a catalyst or hardener for curing the epoxy.

FIG. 7C illustrates a portion of the packaged integrated circuit device 100 after the semiconductor die 340 has been attached to the thermal interface material 345 of packaged integrated circuit device 100 of FIG. 7B, in accordance with an embodiment of the present invention. In various embodiments, the semiconductor die 340 is attached to the thermal interface material 345 by contacting the back side 344 of the semiconductor die 340 to the thermal interface material 345 and hardening the thermal interface material 345. For example, the thermal interface material 345 may include an epoxy that is mixed with a catalyzing agent or hardener before contacting the semiconductor die 340 with the thermal interface material 345. In this example, the epoxy does not fully harden until after the semiconductor die 340 contacts the thermal interface material 345.

Figure 7D:
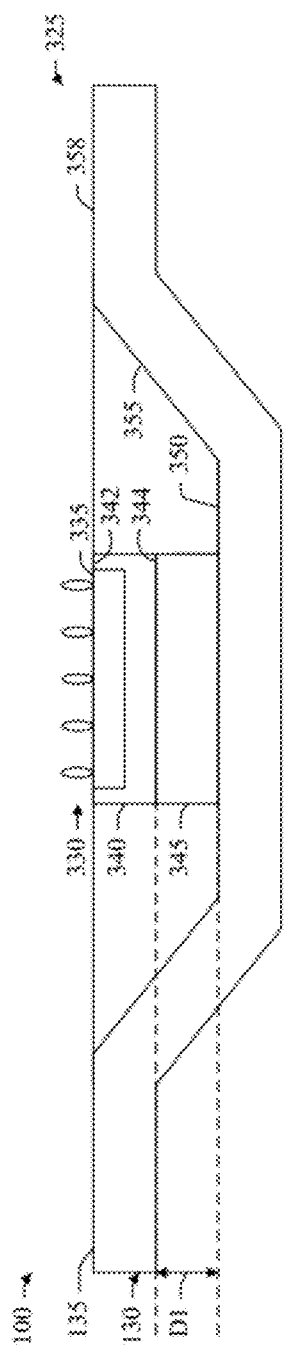
FIG. 7D is a cross-sectional view of a portion of the packaged integrated circuit device of FIG. 1 after conductive taps have been formed on an integrated circuit of the semiconductor die of the packaged integrated circuit device of FIG. 7C, in accordance with an embodiment of the present invention.

FIG. 7D illustrates a portion of the packaged integrated circuit device 100 after the conductive taps 330 have been formed on the integrated circuit 335 of the packaged integrated circuit device 100 of FIG. 7C, in accordance with an embodiment of the present invention. In various embodiments, the conductive taps 330 are solder bumps formed on a portion of the integrated circuit 335 by depositing molten solder on the front side 342 of the semiconductor die 340. For example, the conductive taps 330 may be solder bumps formed on contact pads of the integrated circuit 335.

Figure 7E:
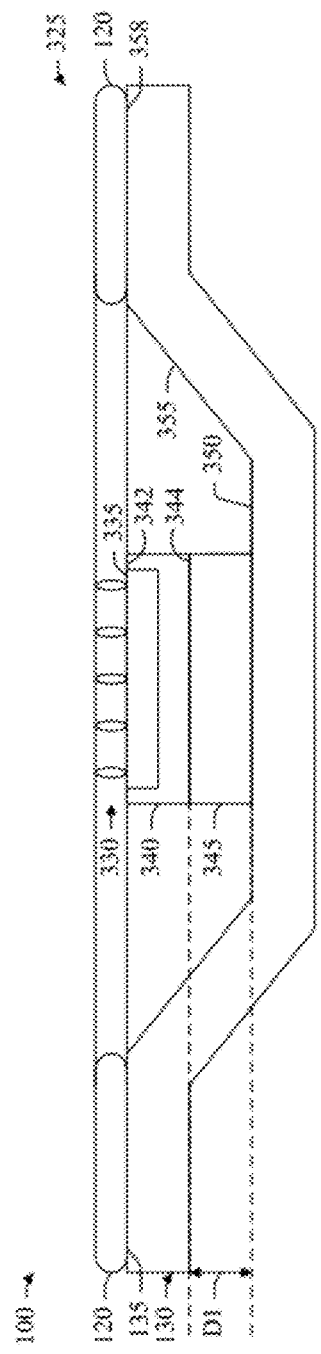
FIG. 7E is a cross-sectional view of a portion of the packaged integrated circuit device of FIG. 1 after a spacer material has been deposited on a heat spreader of the packaged integrated circuit device of FIG. 7D, in accordance with an embodiment of the present invention.

FIG. 7E illustrates a portion of the packaged integrated circuit device 100 after the spacer material 120 has been deposited on the flange surface 358 of the heat spreader 130 in the packaged integrated circuit device 100 of FIG. 7D, in accordance with an embodiment of the present invention. In various embodiments, the spacer material 120 includes a thermally conductive material, such as particles of sapphire ($Al_2O_3$). For example, the spacer material 120 may include an epoxy and a thermally conductive material that are mixed with a catalyst or hardener for curing the epoxy. In some embodiments, the epoxy material of the spacer material 120 is a heat conductive adhesive available from Shin-Etsu Chemical Co., Ltd. of Tokyo, Japan and identified by part number KJR9080. In various embodiments, the thermally conductive material of the space material 120 includes sapphire particles having a dielectric constant of approximately ten (10).

Figure 7F:
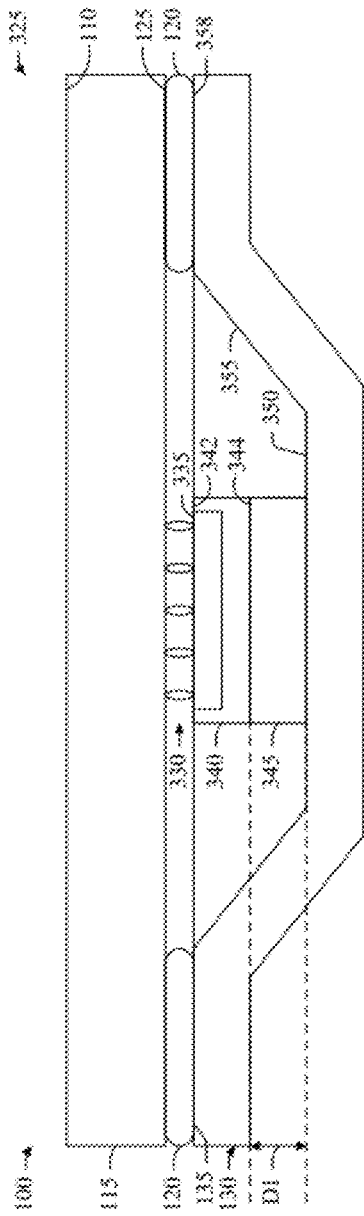
FIG. 7F is a cross-sectional view of a portion of the packaged integrated circuit device of FIG. 1 after a package substrate has been attached to the conductive taps and a spacer material of the packaged integrated circuit device of FIG. 7E, in accordance with an embodiment of the present invention.

FIG. 7F illustrates a portion of the packaged integrated circuit device 100 after the package substrate 115 has been attached to the conductive taps 330 and the spacer material 120 of the packaged integrated circuit device 100 of FIG. 7E, in accordance with an embodiment of the present invention. In various embodiments, the conductive taps 330 are solder bumps and the package substrate 115 is attached to the conductive taps 330 by heating the conductive taps 330 to a molten state, contacting the back side 125 of the package substrate 115 to the conductive taps 330, and allowing the conductive taps 330 to cool into a rigid state (e.g., a solid state). Further, the spacer material 120 includes a mixture of an epoxy and a catalyst or hardener for curing the epoxy, and the package substrate 115 is attached to the spacer material 120 by contacting the back side 125 of the package substrate 115 to the spacer material 120 when spacer material 120 is in a non-rigid state (e.g., a liquid or semi-liquid state) and allowing the spacer material 120 to become rigid (e.g., hardened).

Figure 7G:
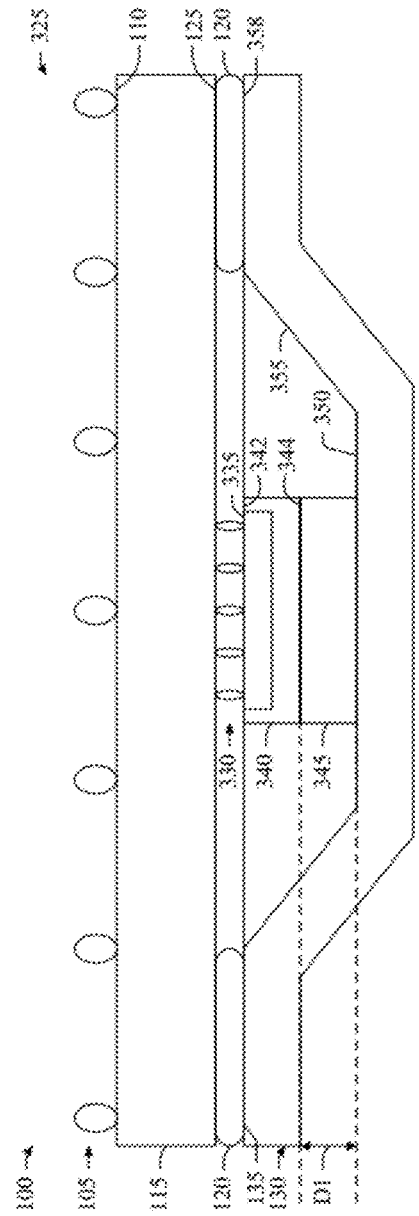
FIG. 7G is a cross-sectional view of the packaged integrated circuit device of FIG. 1 after conductive bumps have been deposited on the package substrate of the packaged integrated circuit device of FIG. 7F, in accordance with an embodiment of the present invention of the present invention.

FIG. 7G illustrates a portion of the packaged integrated circuit device 100 after the conductive bumps 105 have been formed on the package substrate 115 of the packaged integrated circuit device 100 of FIG. 7F, in accordance with an embodiment of the present invention. In various embodiments, the conductive bumps 105 are formed on the front side 110 of the package substrate 115 to establish electrical connections between the conductive bumps 105 and the conductive taps 330 through the package substrate 115. For example, the package substrate 115 may include conductors that establish an electrically conductive path from each conductive bump 105 to a corresponding conductive tap 330. In this way, the conductive bumps 105 are electrically connected to the integrated circuit 335 (e.g., conductive pads of the integrated circuit 335). In various embodiments, the conductive bumps 105 are solder bumps that are formed on the package substrate 115 by depositing molten solder on the front side 110 of the package substrate 115.

Figure 8:
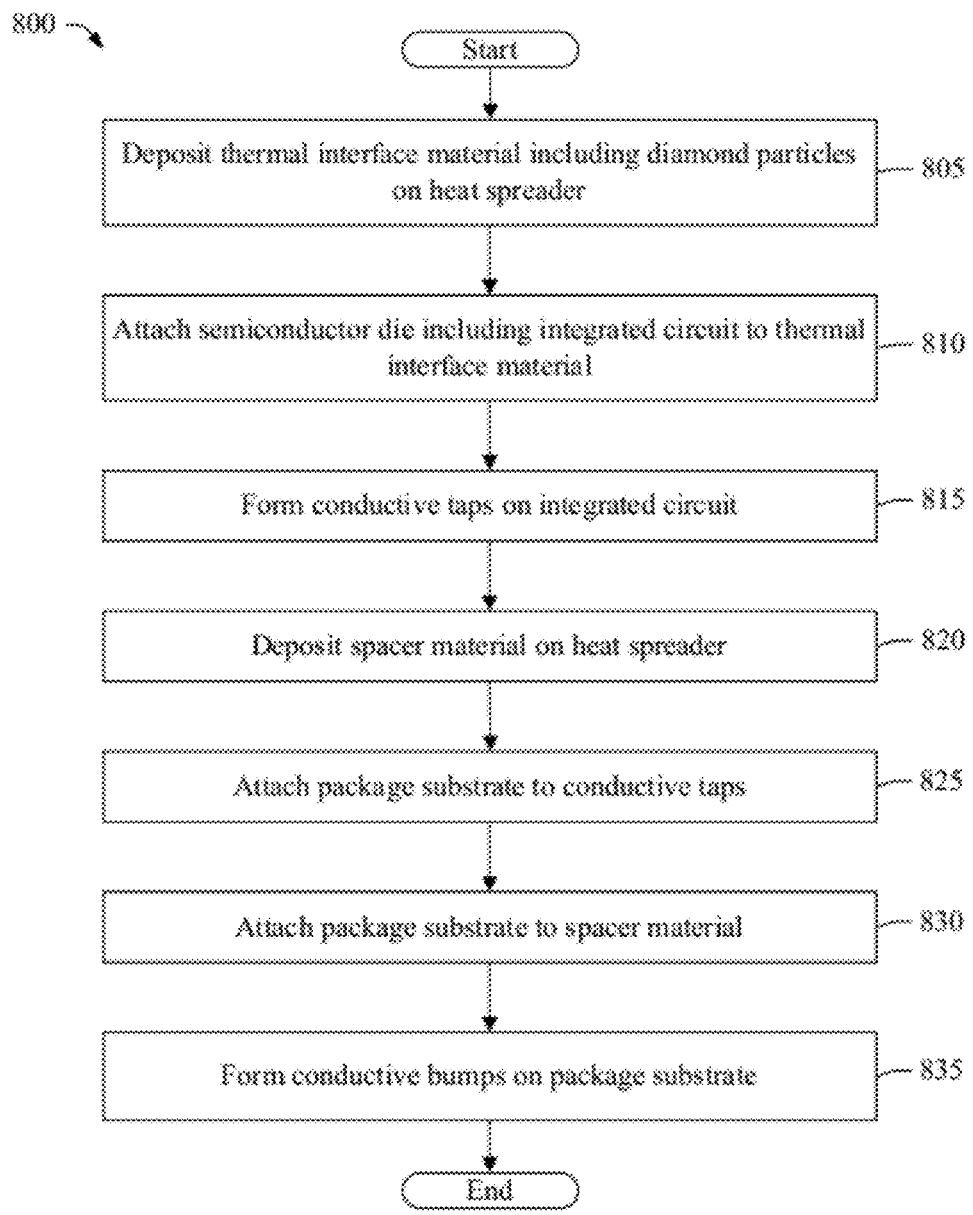
FIG. 8 is a flow chart of a method of manufacturing a packaged integrated circuit device, in accordance with an embodiment of the present invention.

FIG. 8 is a flow chart of a method 800 of manufacturing a packaged integrated circuit device, in accordance with an embodiment of the present invention. In step 805, a thermal interface material containing diamond particles is deposited on a heat spreader. In various embodiments, the thermal interface material 345 containing diamond particles is deposited on the top surface 350 of the heat spreader 130. In some embodiments, the thermal interface material 345 includes an epoxy that is mixed with a catalyst or hardener for curing the epoxy. In these embodiments, the thermal interface material 345 is deposited on the heat spreader 130 when the thermal interface material 345 is in a non-rigid state (e.g., a liquid or semi-liquid state) and before the epoxy is fully hardened.

In various embodiments, the thermal interface material 345 is deposited on the top surface 350 of the heat spreader 130 to establish a distance D1 between the back side 344 of the semiconductor die 340 and the top surface 350 of the heat spreader 130 when the thermal interface material 345 is hardened into a rigid state. In these embodiments, the distance D1 between the back side 344 of the semiconductor die 340 and the top surface 350 of the heat spreader 130 is substantially the same as the thickness of the thermal interface material 345. Moreover, the thermal interface material 345 is deposited on the top surface 350 of the heat spreader 130 to so that the distance D1 between the semiconductor die 340 and the heat spreader 130 is larger than the distance between a semiconductor die and a heat spreader of a conventional packaged integrated circuit device.

Generally, the rate of thermal conduction between a semiconductor die and a heat spreader in a conventional packaged integrated circuit device is maximized by minimizing the thickness of the thermal interface material. Typically, the thickness of a thermal interface material in a conventional packaged integrated circuit device is fifty microns (50 um) or less. In contrast to such a conventional packaged integrated circuit device, the distance D1 between the back side 344 of the semiconductor die 340 and the top surface 350 of the heat spreader 130 is selected to minimize the peak electrostatic discharge current without reducing the rate of thermal conduction between the semiconductor die 340 and the heat spreader 130. The package integrated circuit device 100 obtains this advantage by having a larger distance D1 between the semiconductor die 340 and the heater spreader 130 than that of a conventional packaged integrated circuit device, and by using a thermal interface material 345 having a higher thermal conductivity (e.g., diamond particles). In this way, the peak electrostatic discharge current of the packaged integrated circuit device 100 is reduced without reducing the rate of thermal conduction between the semiconductor die 340 and the heat spreader 130.

In various embodiments, the thickness of the thermal interface material 345 is at least one hundred fifty microns (150 um). In some embodiments, the thickness of the thermal interface material is in a range of one hundred fifty microns to four hundred microns (150 um to 400 um). In one embodiment, the thickness of the thermal interface material 345 is approximately three hundred microns (300 um). In various embodiments in which the packaged integrated circuit device 100 includes an FPGA, for example, the distance D1 between the semiconductor die 340 and the heat spreader 130 is two to six times larger than the distance between a semiconductor die and a heat spreader in a conventional packaged integrated circuit device having substantially the same FPGA. In some embodiments, the packaged integrated circuit device 100 includes an FPGA substantially the same as a conventional Virtex®-type FPGA or Spartan®-type FPGA, both available from Xilinx, Inc. of San Jose, Calif. For example, the packaged integrated circuit device 100 may be a conventional Virtex-5 FPGA or a conventional Spartan-3 FPGA. The method 800 then proceeds to step 810.

In step 810, a semiconductor die including an integrated circuit is attached to the thermal interface material. In various embodiments, the semiconductor die 340 is attached to the thermal interface material 345. In some embodiments, the thermal interface material 345 includes an epoxy that has been mixed with a catalyst or hardener for curing the epoxy. In these embodiments, the semiconductor die 340 is attached to the thermal interface material 345 by contacting the back side 344 of the semiconductor die 340 to the thermal interface material 345 when the thermal interface material 345 is in a non-rigid state (e.g., a liquid or semi-liquid state) and allowing the thermal interface material 345 to harden. The method 800 then proceeds to step 815.

In step 815, conductive taps are formed on the integrated circuit. In various embodiments, the conductive taps 330 are formed on the integrated circuit 335. In some embodiments, the conductive taps 330 are solder bumps formed on the integrated circuit 335 by depositing molten solder on conductive pads of the integrated circuit 335. The method 800 then proceeds to step 820.

In step 820, a spacer material is deposited on the heat spreader. In various embodiments, the spacer material 120 is deposited on the flange surface 358 of the heat spreader 130. In some embodiments, the spacer material 120 includes an epoxy that is mixed with a catalyst or hardener for curing the epoxy. In these embodiments, the spacer material 120 is deposited on the heat spreader 130 when the spacer material 120 is in a non-rigid state (e.g., a liquid or semi-liquid state) and before the epoxy is fully hardened. The method 800 then proceeds to step 825.

In step 825, a package substrate is attached to the conductive taps. In various embodiments, the back side 125 of the package substrate 115 is attached to the conductive taps 330. In some embodiments, the conductive taps 330 are solder taps. In these embodiments, the package substrate 115 is attached to the conductive taps 330 by heating the conductive taps 330 to a molten state, contacting the back side 125 of the package substrate 115 to the conductive taps 330, and allowing the conductive taps 330 to cool into a rigid state. The method 800 then proceeds to step 830.

In step 830, the package substrate is attached to the spacer material. In various embodiments, the back side 125 of the package substrate 115 is attached to the spacer material 120. In some embodiments, the spacer material 120 includes an epoxy that is mixed with a catalyst or harder for curing the epoxy. In these embodiment, the package substrate 115 is attached to the spacer material 120 by contacting the back side 125 of the package substrate 115 to the spacer material 120 when spacer material 120 is in a non-rigid state (e.g., a liquid or semi-liquid state) and allowing the epoxy to cure (e.g., harden) into a rigid state. The method 800 then proceeds to step 835.

In step 835, conductive bumps are formed on the package substrate. In various embodiments, the conductive bumps 105 are formed on the front side 110 of the package substrate 115. Moreover, the conductive bumps 105 establish electrical connections between the conductive bumps 105 and the integrated circuit 335 through conductive paths in the package substrate 115 and the conductive taps 330. In various the conductive bumps 105 are solder bumps that are formed on the front side 110 of the package substrate 115 by heating the conductive taps 330 into a molten state (e.g., molten solder), depositing the conductive taps 330 on the front side 110 of the package substrate 115 when the conductive taps 330 are in the molten state, and allowing the conductive taps 330 to cool into a rigid state (e.g., a solid state). The method 800 then ends.

In various embodiments, the method 800 may include more or fewer steps than the steps 805-835 described above and illustrated in FIG. 8. In some embodiments, the steps 805-835 of the method 800 may be performed in a different order from that described above and illustrated in FIG. 8. For example, step 815 may be performed before step 805 or step 810. In some embodiments, one or more of the steps 805-835 of the method 800 may be performed in parallel with each other or substantially simultaneously with each other. For example, steps 825 and 830 may be performed substantially simultaneously with each other.

In various embodiments, the thermal interface material 345 is deposited on the top surface 350 of the heat spreader 130 such that the distance D1 between the semiconductor die 340 and the heat spreader 130 is larger, e.g., two to six times larger, than the distance between a semiconductor die and a heat spreader of a conventional packaged integrated circuit device. Moreover, the distance D1 between the semiconductor die 340 and the heat spreader 130 is selected to minimize the peak electrostatic discharge current without reducing the rate of thermal conduction between the semiconductor die and the heat spreader of the conventional packaged integrated circuit device. Although increasing the distance D1 between the semiconductor die 340 and the heat spreader 130 in isolation tends to decrease the rate of thermal conduction between the semiconductor die 340 and the heat spreader 130, the thermal interface material 345 contains diamond particles to compensate for the increased distance D1 between the semiconductor die 340 and the heat spreader 130. In this way, the peak electrostatic discharge current of the packaged integrated circuit device 100 is reduced without reducing the rate of thermal conduction between the semiconductor die 340 and the heat spreader 130.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims, and not by the above detailed description.

What is claimed is:

1. A packaged integrated circuit device, comprising:
   a package substrate;
   a semiconductor die comprising an integrated circuit and coupled to the package substrate;
   a heat spreader for dissipating heat to an ambient environment, the heat spreader separated from the semiconductor die by a distance of at least one hundred fifty microns;
   a thermal interface material disposed between the heat spreader and the semiconductor die for conducting heat from the semiconductor die to the heat spreader, the thermal interface material comprising a mixture of diamond particles and an epoxy for minimizing a peak electrostatic discharge current of the packaged integrated circuit device; and
   a spacer material for attaching the package substrate to the heat spreader,
   wherein the thermal interface material is a high-conductivity thermal interface material and the spacer material is a low-conductivity thermal interface material.

2. The packaged integrated circuit device of claim 1, wherein the thermal interface material has a thickness selected to reduce capacitance between the semiconductor die and the heat spreader over that of a conventional packaged integrated circuit device without reducing a rate of thermal conduction from the semiconductor die to the heat spreader.

3. The packaged integrated circuit device of claim 1, wherein the integrated circuit comprises a field programmable gate array.

4. The packaged integrated circuit device of claim 1, wherein the heat spreader is separated from a back surface of the semiconductor die by a distance of approximately three hundred microns.

5. The packaged integrated circuit device of claim 1, wherein the thermal interface material has a thermal conductivity greater than one thousand watts per meter per kelvin.

6. The packaged integrated circuit device of claim 1, further comprising:
   a plurality of conductive taps formed on the integrated circuit; and
   a plurality of conductive bumps formed on the package substrate for establishing electrical connections to the plurality of conductive taps through the package substrate.

7. A method of manufacturing a packaged integrated circuit device having a reduced electrostatic discharge peak current, the method comprising:
   depositing a thermal interface material on a heat spreader for conducting heat from a semiconductor die to the heat spreader, the thermal interface material comprising a mixture of diamond particles and an epoxy for minimizing a peak electrostatic discharge current of the packaged integrated circuit device; and
   attaching the semiconductor die comprising an integrated circuit to the thermal interface material such that the heat spreader is separated from the semiconductor die by a distance of at least one hundred fifty microns;
   depositing a spacer material on the heat spreader; and
   attaching a package substrate to the heat spreader,
   wherein the attaching of the package substrate to the heat spreader includes attaching the package substrate to the spacer material, and
   wherein the thermal interface material is a high-conductivity thermal interface material and the spacer material is a low-conductivity thermal interface material.

8. The method of claim 7, wherein depositing the thermal interface material on the heat spreader comprises selecting a thickness of the thermal interface material to reduce capacitance between the semiconductor die and the heat spreader over that of a conventional packaged integrated circuit device without reducing a rate of thermal conduction from the semiconductor die to the heat spreader.

9. The method of claim 7, wherein the semiconductor die is separated from the heat spreader by a distance of approximately three hundred microns.

10. The method of claim 7, wherein the thermal interface material has a thermal conductivity greater than one thousand watts per meter per kelvin.

11. The method of claim 7, further comprising:
    forming conductive taps on the integrated circuit to establish electrical connections between the conductive taps and the integrated circuit;
    attaching the package substrate to the conductive taps; and
    forming conductive bumps on the package substrate to establish an electrical connection between the conductive bumps and the conductive taps through the package substrate.

12. A packaged integrated circuit device, comprising:
    a package substrate;
    a semiconductor die comprising an integrated circuit and coupled to the package substrate;
    a plurality of conductive taps formed on the integrated circuit for establishing electrical connections between the integrated circuit and the package substrate;
    a heat spreader for dissipating heat to an ambient environment of the heat spreader, the heat spreader separated from a back surface of the semiconductor die by a distance of at least one hundred fifty microns;
    a thermal interface material disposed between the heat spreader and the semiconductor die for conducting heat away from the semiconductor die to the heat spreader, the thermal interface material comprising a mixture of diamond particles and an epoxy for minimizing a peak electrostatic discharge current of the packaged integrated circuit device; and
    a spacer material for attaching the package substrate to the heat spreader,
    wherein the thermal interface material is a high-conductivity thermal interface material and the spacer material is a low-conductivity thermal interface material.

13. The packaged integrated circuit device of claim 12, wherein the thermal interface material has a thickness selected to reduce capacitance between the semiconductor die and the heat spreader over that of a conventional packaged integrated circuit device without reducing a rate of thermal conduction from the semiconductor die to the heat spreader.

14. The packaged integrated circuit device of claim 12, wherein the integrated circuit comprises a field programmable gate array.

15. The packaged integrated circuit device of claim 12, wherein the semiconductor die is separated from the heat spreader by a distance of approximately three hundred microns.

16. The packaged integrated circuit device of claim 12, wherein the thermal interface material has a thermal conductivity greater than one thousand watts per meter per kelvin.

* * * * *